US008785285B2

(12) United States Patent
Tsai et al.

(10) Patent No.: US 8,785,285 B2
(45) Date of Patent: Jul. 22, 2014

(54) SEMICONDUCTOR DEVICES AND METHODS OF MANUFACTURE THEREOF (75) Inventors: Ji-Yin Tsai, Zhudong Township (TW); Yao-Tsung Huang, Kaohsiung (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 88 days.

(21) Appl. No.: 13/415,710

(22) Filed: Mar. 8, 2012

(65) Prior Publication Data
US 2013/0234203 A1 Sep. 12, 2013

(51) Int. Cl.
*H01L 21/336* (2006.01)

(52) U.S. Cl.
USPC .... 438/300; 438/283; 438/285; 257/E21.409; 257/E21.421

(58) Field of Classification Search
USPC ............... 438/300; 257/E21.409, E21.421
See application file for complete search history.

(56) References Cited

U.S. PATENT DOCUMENTS

| 3,909,304 A | 9/1975 | Cho |
| 7,112,848 B2 | 9/2006 | Lee |
| 7,132,338 B2 | 11/2006 | Samoilov et al. |
| 7,518,196 B2 * | 4/2009 | Chau et al. ............... 257/401 |
| 7,910,415 B2 | 3/2011 | Mishima |
| 8,110,486 B2 | 2/2012 | Matsumoto et al. |
| 8,338,259 B2 | 12/2012 | Wu et al. |
| 2003/0052406 A1 | 3/2003 | Lochtefeld et al. |
| 2006/0057859 A1 | 3/2006 | Chen |
| 2007/0059875 A1 | 3/2007 | Mishima |
| 2007/0111439 A1 | 5/2007 | Jung et al. |
| 2007/0128782 A1 | 6/2007 | Liu et al. |
| 2007/0131969 A1 | 6/2007 | Sanuki et al. |
| 2007/0145487 A1 | 6/2007 | Kavalieros et al. |
| 2008/0044960 A1 * | 2/2008 | Al-Bayati et al. ............ 438/156 |
| 2008/0251851 A1 | 10/2008 | Pan et al. |
| 2009/0239344 A1 | 9/2009 | Jeong et al. |
| 2009/0280612 A1 * | 11/2009 | Shimamune et al. ......... 438/300 |
| 2010/0252816 A1 | 10/2010 | Ko et al. |
| 2011/0147828 A1 * | 6/2011 | Murthy et al. ................ 257/327 |
| 2012/0068193 A1 * | 3/2012 | Chan et al. ..................... 257/77 |
| 2012/0104470 A1 | 5/2012 | Ponoth et al. |

FOREIGN PATENT DOCUMENTS

| JP | 2009164454 A | 7/2009 |
| KR | 20090101831 A | 9/2009 |
| KR | 20100016417 A | 2/2010 |
| KR | 20110111550 A | 10/2011 |

OTHER PUBLICATIONS

Wong, Hoong-Shing et al., "Silicon—Carbon Stressors With High Substitutional Carbon Concentration and in Situ Doping Formed in Source/Drain Extensions of n-Channel Transistors," IEEE Electron Device Letters, vol. 29, No. 5, May 2008, pp. 460-463.

* cited by examiner

*Primary Examiner* — Angel Roman
(74) *Attorney, Agent, or Firm* — Slater and Matsil, L.L.P.

(57) ABSTRACT

Semiconductor devices and methods of manufacture thereof are disclosed. In one embodiment, a method of manufacturing a semiconductor device includes forming a channel region in a workpiece, and forming a source or drain region proximate the channel region. The source or drain region includes a contact resistance-lowering material layer comprising SiP, SiAs, or a silicide. The source or drain region also includes a channel-stressing material layer comprising SiCP or SiCAs.

20 Claims, 9 Drawing Sheets

SEMICONDUCTOR DEVICES AND METHODS OF MANUFACTURE THEREOF

CROSS-REFERENCE TO RELATED APPLICATIONS

This application relates to the following co-pending and commonly assigned patent applications: Ser. No. 13/178,294, filed on Jul. 7, 2011, entitled, "In-Situ Doping of Arsenic for Source and Drain Epitaxy," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Multiple gate field-effect transistors (MuGFETs) are a recent development in semiconductor technology which typically are metal oxide semiconductor FETs (MOSFETs) that incorporate more than one gate into a single device. The multiple gates may be controlled by a single gate electrode, where the multiple gate surfaces act electrically as a single gate, or by independent gate electrodes. One type of MuGFET is referred to as a FinFET, which is a transistor structure with a fin-like semiconductor channel that is raised vertically out of the silicon surface of an integrated circuit.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to semiconductor device manufacturing, and more particularly to the formation of source and drain regions of transistors. Novel manufacturing methods for semiconductor device and transistors, and structures thereof, will be described herein.

Figure 1:
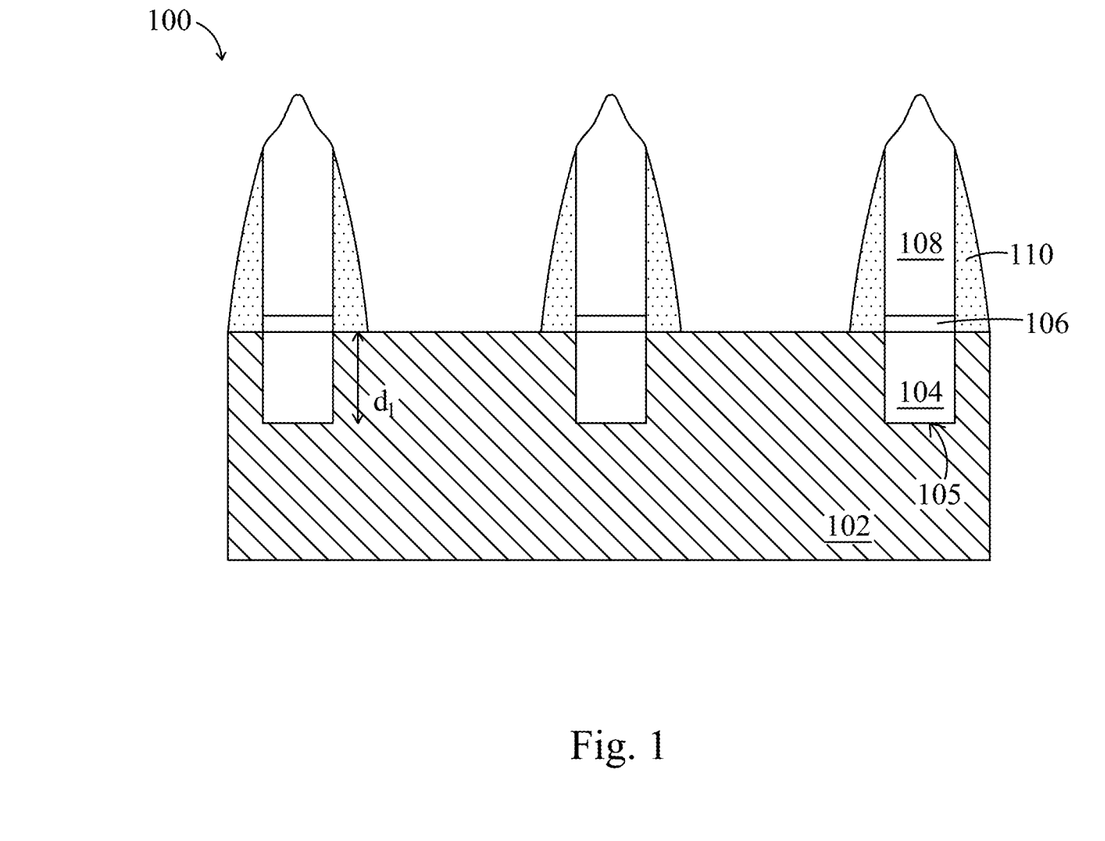
FIGS. 1 through 4 show cross-sectional views of a method of manufacturing a semiconductor device at various stages of manufacturing in accordance with an embodiment of the disclosure implemented in a FinFET application.

FIGS. 1 through 4 show cross-sectional views of a method of manufacturing a semiconductor device 100 in accordance with an embodiment of the disclosure implemented in a FinFET application. Referring first to FIG. 1, to manufacture the device, a workpiece 102 is provided. A plurality of fins 104 of a semiconductive material are formed in the workpiece 102 in the embodiment shown in FIGS. 1 through 7.

The fins 104 may be formed in the workpiece 102 using a method described in patent application Ser. No. 13/178,294, filed on Jul. 7, 2011, entitled, "In-Situ Doping of Arsenic for Source and Drain Epitaxy," (see FIGS. 1 through 4, 5A, and 5B, fins 30, and description thereof of the related application) which is incorporated herein by reference. A gate dielectric material is formed over the channel regions 105 comprising the fins 104, a gate material is formed over the gate dielectric material, and the gate material and the gate dielectric material are patterned to form a gate 108 and gate dielectric 106, as shown in FIG. 1 of the present disclosure (and as shown in FIGS. 6A and 6B of the related reference). Sidewall spacers 110 are formed over the gate 108 and gate dielectric 106. Note that the view shown in FIG. 1 of the present disclosure is a similar view shown in FIG. 6B of the related application. Shallow trench isolation (STI) regions are formed in the workpiece 102 but are not visible in the view in FIG. 1; the STI regions are disposed in and out of the paper in the view shown, spaced away from the paper, within the workpiece 102.

A top portion of the gates 108 may be narrower than the bottom portion, e.g., if the gate 108 top portion is formed using an epitaxial growth process. The channel regions 105 comprising the fins 104 comprise a height within the workpiece 102 comprising dimension $d_1$. Dimension $d_1$ may comprise about 10 to 50 nm, although alternatively, dimension $d_1$ may comprise other values. As described in the related application, the fins 104 may comprise SiGe, silicon, or a III-V compound semiconductor that comprises a group-III element and a group-V element. The III-V compound semiconductor may include, but is not limited to, GaAs, InP, GaN, InGaAs, InAlAs, GaSb, AlSb, AlAs, AlP, GaP, combinations thereof, and multi-layers thereof. The material of the fins 104 may be selected to achieve a channel region 105 having a high mobility, such as about 3,000 to 40,000 $cm^2$/V-s, for example, although alternatively, the mobility of the fins 104 may comprise other values. The fins 104 may alternatively comprise other semiconductive materials in accordance with embodiments disclosed herein.

Only three transistor gates 108 and fins 104 are shown in the drawings; however, in accordance with embodiments, dozens or hundreds of gates 108 and fins 104 may be formed across the surface of a workpiece 102 for each die to be manufactured on the workpiece 102, for example, not shown.

Figure 2:
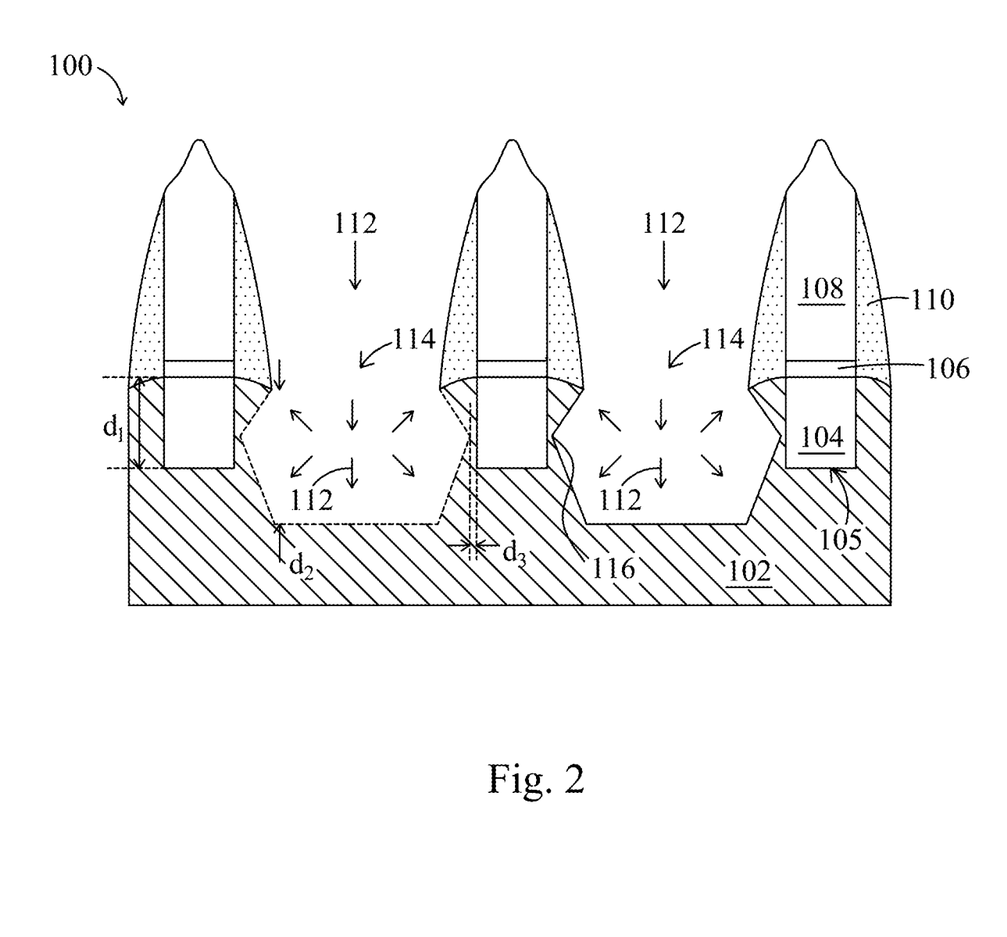

In accordance with embodiments, the workpiece 102 is recessed proximate the channel regions 105, e.g., between the sidewall spacers 110, as shown in FIG. 2. The workpiece 102 is recessed using an etch process 112 that includes an anisotropic component, so that a portion of the workpiece 102 material is removed from beneath the sidewall spacers 110. The recesses 114 formed in the workpiece 102 comprise a depth within a top surface of the workpiece 102 comprising dimension $d_2$. Dimension $d_2$ is larger than dimension $d_1$ in accordance with embodiments of the present disclosure. In some embodiments, dimension $d_2$ is about twice dimension $d_1$ or greater (e.g., see the embodiments in FIGS. 2 through 4, and 5). In other embodiments, dimension $d_2$ is about three times more than dimension $d_1$ or greater (see the embodiment in FIG. 6).

The recesses 114 may comprise a substantially trapezoidal shape as shown, due to the etch process 112 chemistries and/or the crystal structure of the workpiece 102, for example. Alternatively, the recesses 114 may comprise other shapes, such as rounded or elliptical (see FIG. 8. In accordance with embodiments, the etch process 112 is selected to achieve a "proximity push" or a close proximity to the fins 104 comprising the channel regions 105. A widest portion of the recesses 114, shown at 116, may be spaced apart from the fins 104 by a dimension $d_3$ that may comprise about 10 nm or less in some embodiments. Dimension $d_3$ may alternatively comprise other values.

Figure 3:
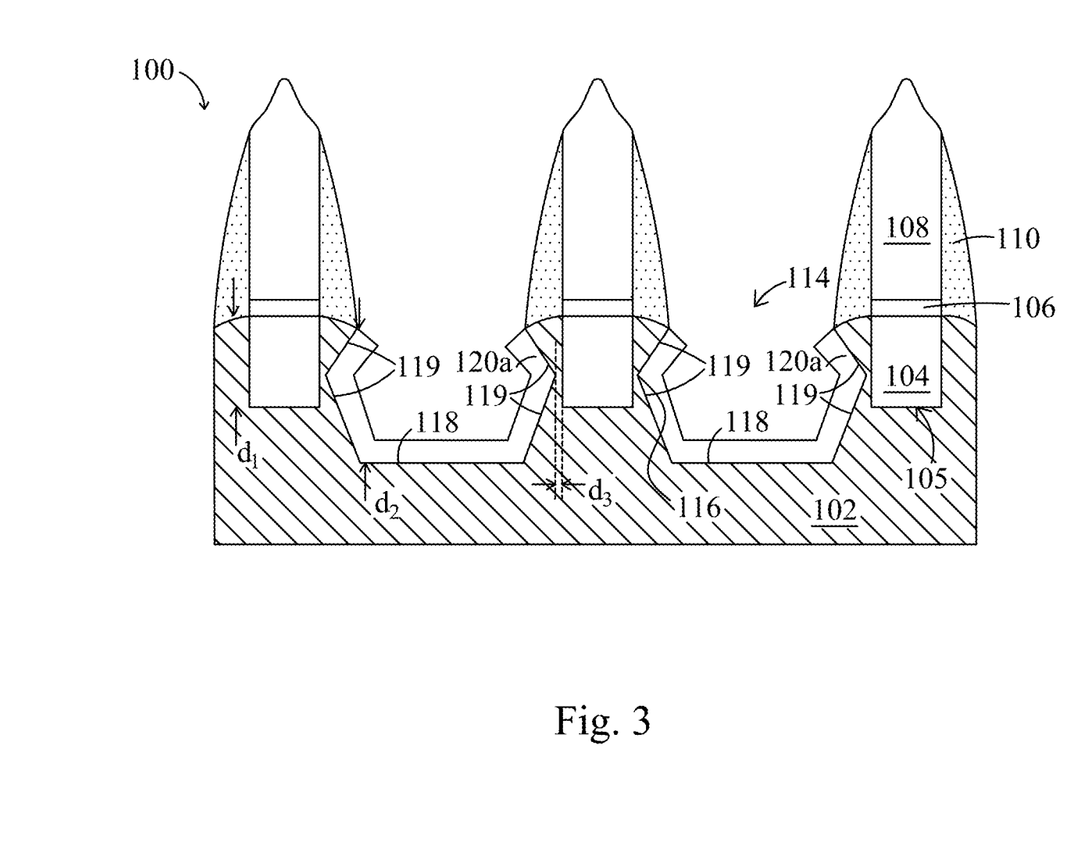
Figure 4:
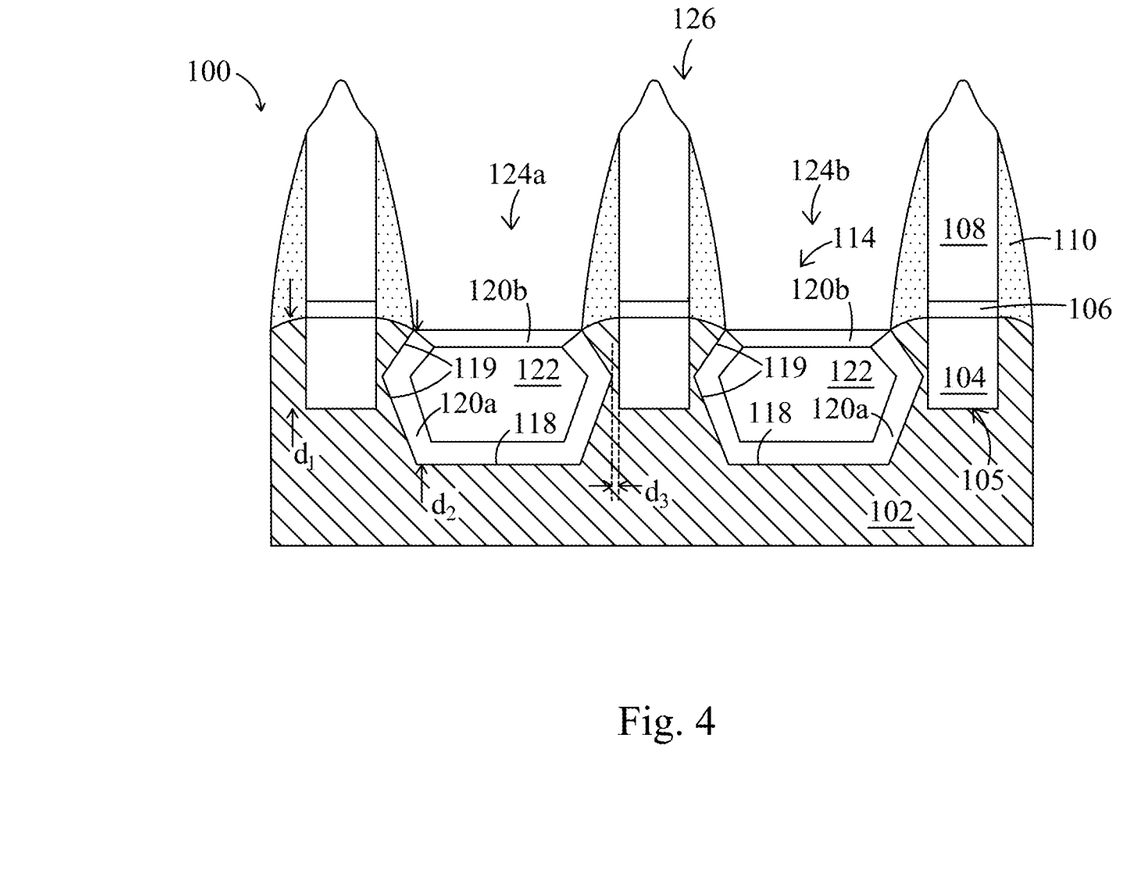

Next, source regions 124a and drain regions 124b are formed within the recesses 114, as shown in FIGS. 3 and 4. In accordance with embodiments, forming the recesses 114 in very close proximity to the channel regions 105 advantageously results in the formation of source and drain regions 124a and 124b having a minimal distance away from the channel regions 105, which reduces contact resistance. In the first embodiment, first, a first contact resistance-lowering material layer 120a is deposited in the recesses 114, as shown in FIG. 3. The first contact resistance-lowering material layer 120a comprises SiP or SiAs formed by a growth process, such as an epitaxial growth process or chemical vapor deposition (CVD) process, for example. The first contact resistance-lowering material layer 120a is substantially conformal as deposited and may comprise a thickness of about 10 nm, for example. The first contact resistance-lowering material layer 120a may be formed using a selective growth or deposition process that is adapted to form on the workpiece 102 material (or on optional liners 118 and 119, to be described further herein), but not on the sidewall spacers 110 or the top surfaces of the gates 108, for example. Alternatively, the first contact resistance-lowering material layer 120a may be formed using other methods and may comprise other dimensions.

In some embodiments, the first contact resistance-lowering material layer 120a may be formed using a low growth temperature using a precursor such as trisilane ($Si_3H_8$), arsine ($AsH_3$), and/or other precursors. The first contact resistance-lowering material layer 120a may be highly doped to achieve a very low resistance. For example, the first contact resistance-lowering material layer 120a may have a doping concentration of phosphorus, arsenic, or other substances of about $1\times10^{20}$ to $1\times10^{21}$ and a resistance of about 0.2 to 0.4 milliohm-cm. Alternatively, the first contact resistance-lowering material layer 120a may be doped by other amounts and may comprise other values of resistance. The first contact resistance-lowering material layer 120a is adapted to lower a contact resistance, e.g., of the source and drain regions 124a and 124b to adjacent components and elements, such as the workpiece 102 and the channel region 105.

Before the formation of the first contact resistance-lowering material layer 120a, two optional thin material liners 118 and 119 may be formed within the recesses 114. Liner 118, also referred to herein as a first liner, may comprise a bottom-up epitaxial growth of a layer of SiP on the bottom surfaces of the recesses 114. The formation of the liner 118 may comprise a <001> crystal growth orientation, for example. Liner 118 may increase the proximity of the source and drain regions 124a and 124b to the fins 104, for example. Liner 119, also referred to herein as a second liner, may comprise a fin sidewall growth of a layer of SiAs on sidewalls of the recesses 114. The formation of the liner 119 may comprise a <110> crystal growth orientation, for example. Liner 119 may create current spreading on the fin 104 sidewalls, increasing current transport efficiency through the entire fin 104. Liners 118 and 119 may have a thickness of about 2 to 10 nm, for example, although alternatively, the liners 118 and 119 may comprise other dimensions. Liners 118 and 119 may also be included in the additional embodiments to be described herein with reference to FIGS. 5 through 8, for example (not shown in the drawings).

Next, a channel-stressing material layer 122 is deposited in the recesses 114, as shown in FIG. 4, over the first contact resistance-lowering material layer 120a. The channel-stressing material layer 122 may comprise SiCP or SiCAs formed by a growth process, such as an epitaxial growth process or chemical vapor deposition (CVD) process, for example. The channel-stressing material layer 122 may be deposited to substantially fill the recesses 114 or to fill the recesses 114 to a predetermined level below a top surface of the workpiece 102, for example. The channel-stressing material layer 122 may be formed using epitaxial growth of SiCP in a <001> crystal growth orientation, for example. Alternatively, the channel-stressing material layer 122 may be formed using other methods and may comprise other dimensions. In some embodiments, the channel-stressing material layer 122 may be formed using a low growth temperature using a precursor such as trisilane ($Si_3H_8$), hexachlorodisilane2 (HCD: $Si_2Cl_6$), arsine ($AsH_3$), monomethylsilane (MMS: $SiH_3CH_3$), and/or other precursors. The channel-stressing material layer 122 may be highly doped to achieve a very low resistance. For example, the channel-stressing material layer 122 may have a doping concentration of phosphorus, arsenic, or other substances of about $1\times10^{19}$ to $1\times10^{21}$ and a resistance of about 0.3 to 0.7 milliohm-cm. Alternatively, the channel-stressing material layer 122 may be doped by other amounts and may comprise other values of resistance. The channel-stressing material layer 122 is doped with C in some embodiments to induce tensile strain of the channel region 105, for example. The channel-stressing material layer 122 is adapted to function as a stressor, to create tensile stress in the channel region 105 comprising the fins 104, for example.

Then, a second contact resistance-lowering material layer 120b is deposited in or over the recesses 114 over the channel-stressing material layer 122, also shown in FIG. 4. The second contact resistance-lowering material layer 120b may comprise similar materials grown by similar methods and using similar precursors, similar doping concentrations, and similar resistances as described for the first contact resistance-lowering material layer 120a, for example. The formation of the second contact resistance-lowering material layer 120b may comprise a selective growth or deposition process that is adapted to form on the channel-stressing material layer 122, but not on the sidewall spacers 110 or the top surfaces of the gates 108, for example. Alternatively, the second contact resistance-lowering material layer 120b may be formed using other methods and may comprise other dimensions. The second contact resistance-lowering material layer 120b is adapted to lower a contact resistance, e.g., of the source and drain regions 124a and 124b, to adjacent components and elements, such as subsequently formed contacts (see contacts 130 in FIG. 7). The top surface of the second contact resistance-lowering material layer 120b may be substantially coplanar with the top surface of the workpiece 102 in some embodiments, although alternatively, the top surface of the second contact resistance-lowering material layer 120b may be lower than, or higher than the top surface of the workpiece 102.

Thus, in the embodiment shown in FIG. 4, the novel source and drain regions 124a and 124b of the transistor 126 formed comprise multi-layer structures that achieve improved functionality due to the lower contact resistance and increased stress on the channel regions 105 comprising the fins 104. The source and drain regions 124a and 124b are advantageously disposed in close proximity to the channel regions 105: the source and drain regions 124a and 124b are spaced apart from the channel regions 105 comprising the fins 104 by about 20 nm or less at a widest point of the source or drain regions 124a and 124b, e.g., at the widest portion 116 of the recess 114.

Figure 5:
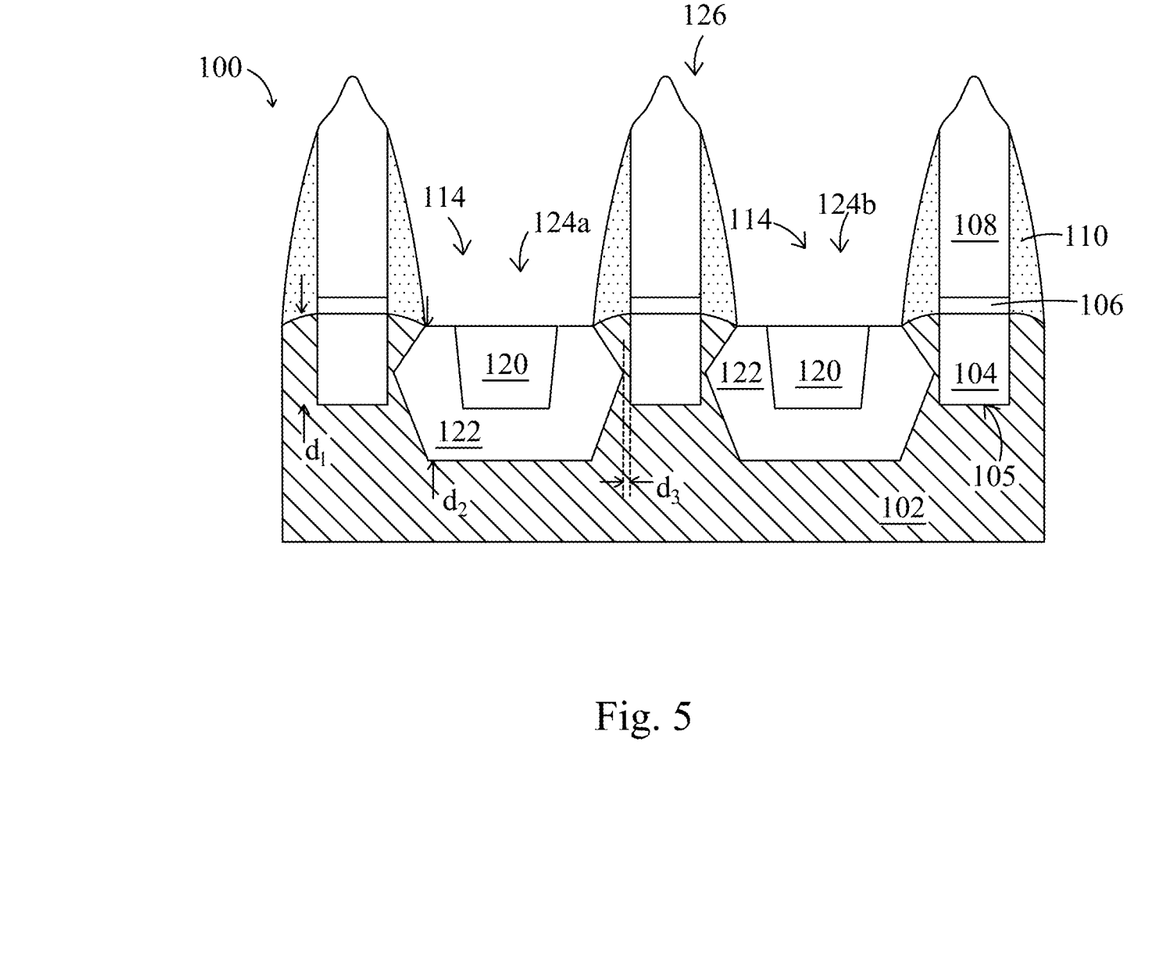
FIGS. 5 and 6 are cross-sectional views of a second and third embodiment, respectively, implemented in a FinFET application.

FIG. 5 illustrates a cross-sectional view of a second embodiment of the present disclosure implemented in a FinFET application. In this embodiment, after the recesses 114 are formed as described for the first embodiment and after the optional liners 118 and 119 are formed in the recesses 114, a channel-stressing material layer 122 is formed to partially fill the recesses 114, as shown in FIG. 5. The shape of the channel-stressing material layer 122 may substantially conform to the topography of the recess 114. The thickness of the channel-stressing material layer 122 may comprise about 15 to 20 nm in this embodiment, although alternatively, the channel-stressing material layer 122 may comprise other dimensions. The channel-stressing material layer 122 may be formed using similar methods, precursors, doping levels, and resistances as described for the channel-stressing material layer 122 in the first embodiment, for example. The channel-stressing material layer 122 is formed on sidewalls and a bottom surface of the workpiece 102 within the recesses 114, or optionally, over the liners 118 and 119 on the bottom surface and sidewalls, respectively, that were described in the first embodiment.

A contact resistance-lowering material layer 120 is then formed over the channel-stressing material layer 122, as shown in FIG. 5. The contact resistance-lowering material layer 120 may comprise similar materials formed using similar methods, precursors, doping levels, and resistances as described for the contact resistance-lowering material layer 120a in the first embodiment. Alternatively, the contact resistance-lowering material layer 120 may comprise a silicide such as $SiNi_x$ or other silicide materials, as examples. The contact resistance-lowering material layer 120 lowers a contact resistance of the source and drain regions 124a and 124b.

Thus, in the second embodiment, the channel-stressing material layer 122 is substantially conformal and directly contacts the workpiece 102 or directly contacts liners 118 and 119 formed over the workpiece 102 in the recesses 114, and the contact resistance-lowering material layer 120 on the top surface of the source and drain regions 124a and 124b may comprise SiP, SiAs, or a silicide.

Figure 6:
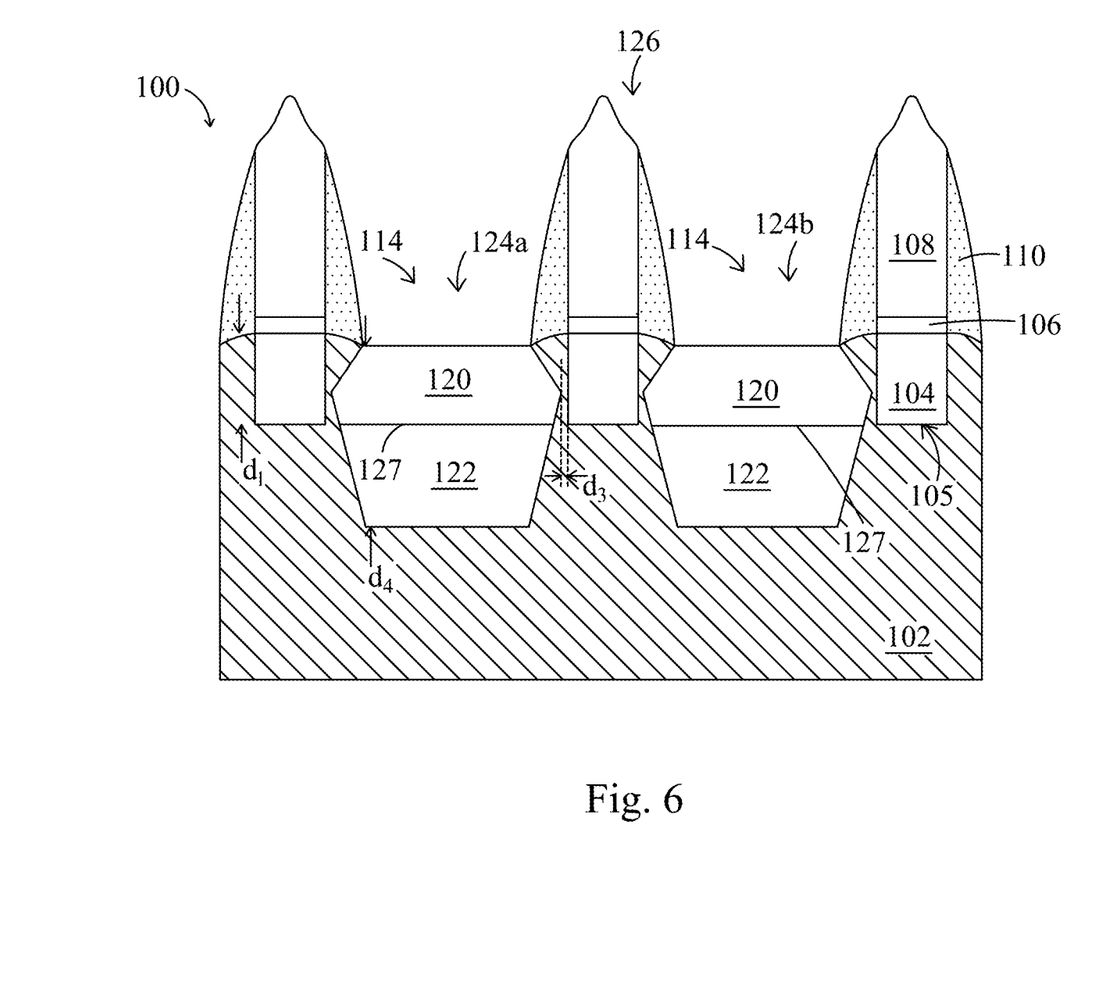

FIG. 6 illustrates a cross-sectional view of a third embodiment of the present disclosure implemented in a FinFET application. In this embodiment, the channel-stressing material layer 122 is formed first within the recesses 114, which creates tensile strain in the channel region 105 comprising the fins 104. The channel-stressing material layer 122 does not comprise a conformal deposition process in this embodiment, as in the second embodiment. Rather, the channel-stressing material layer 122 is formed in a lower part of the recesses 114 using a non-conformal deposition process. The channel-stressing material layer 122 may be formed using similar methods, precursors, doping levels, and resistances as described for the channel-stressing material layer 122 in the first embodiment, for example. Then a contact resistance-lowering material layer 120 is formed over the channel-stressing material layer 122 to fill the recesses, as shown in FIG. 6. The contact resistance-lowering material layer 120 may be formed using similar methods, precursors, doping levels, and resistances as described for the first contact resistance-lowering material layer 120a in the first embodiment, for example.

The recess 114 in the embodiment shown in FIG. 6 may comprise a depth having a dimension $d_4$, wherein dimension $d_4$ is about three times greater than the dimension $d_1$ of the height of the fins 104 comprising the channel region 105. A boundary 127 between the contact resistance-lowering material layer 120 and the channel-stressing material layer 122 may be disposed proximate a bottom of the channel region 105 in this embodiment. The location of the boundary 127 may be optimized for the performance of the transistor 126. For example, the boundary 127 may be moved upwards or downwards in the recesses 114 by forming more or less of the channel-stressing material layer 122, respectively.

The formation of the channel-stressing material layer 122 may be controlled to achieve a desired shape of the channel-stressing material layer 122, e.g., to be conformal as shown in FIG. 5 or non-conformal as shown in FIG. 6 by altering one or more parameters of the deposition process, e.g., by controlling the processing temperature, pressure, flow rates of precursors, deposition, and/or etch components of the deposition process.

Figure 7:
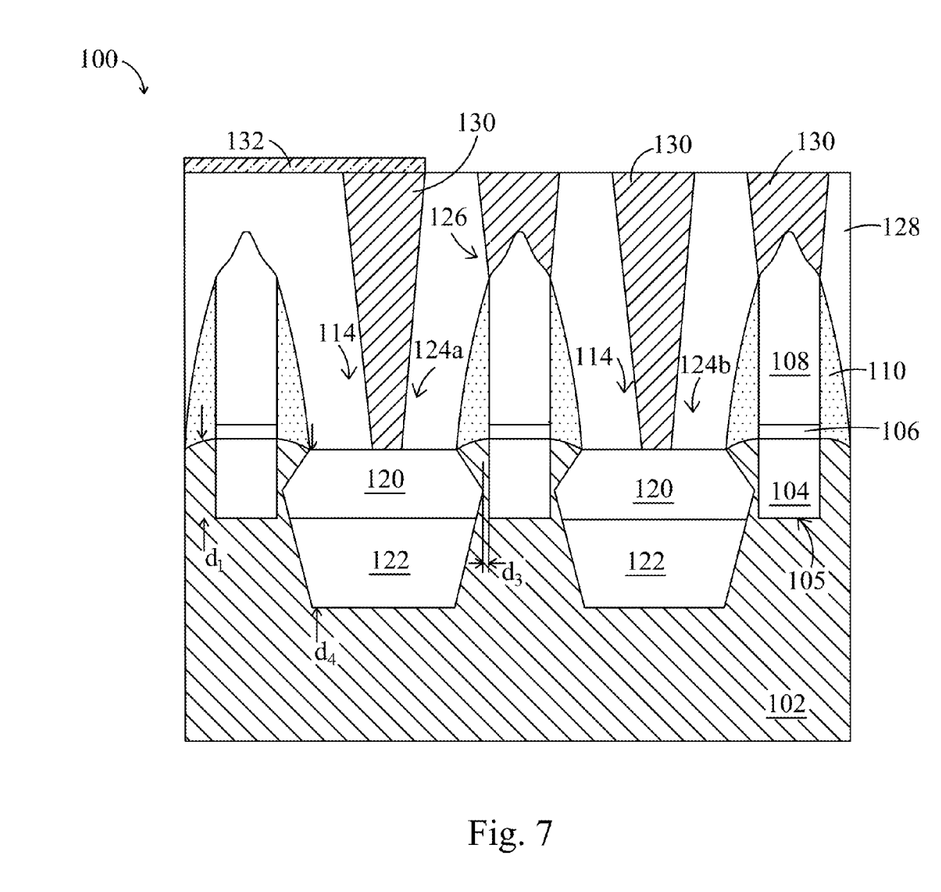
FIG. 7 is a cross-sectional view of the embodiment shown in FIG. 6 after additional material layers are formed over the semiconductor device.

After the novel source and drain regions 124a and 124b described herein are formed, the manufacturing process for the transistors 126 and semiconductor devices 100 is then continued. For example, FIG. 7 is a cross-sectional view of the embodiment shown in FIG. 6 after additional material layers are formed over the semiconductor device 100. An insulating material 128 that may comprise an inter-level dielectric (ILD) or other insulators may be formed over the transistors 126 and the source and drain regions 124a and 124b. Contacts 130 may be formed in the insulating material 128 that comprise a conductive material and make electrical contact with the gates 108 and source and drain regions 124a and 124b, as shown. Conductive lines 132 may be formed over the contacts 130 that make electrical connections to upper material layers (not shown) or contact pads (also not shown) on a top surface of a completed semiconductor device 100.

Figure 8:
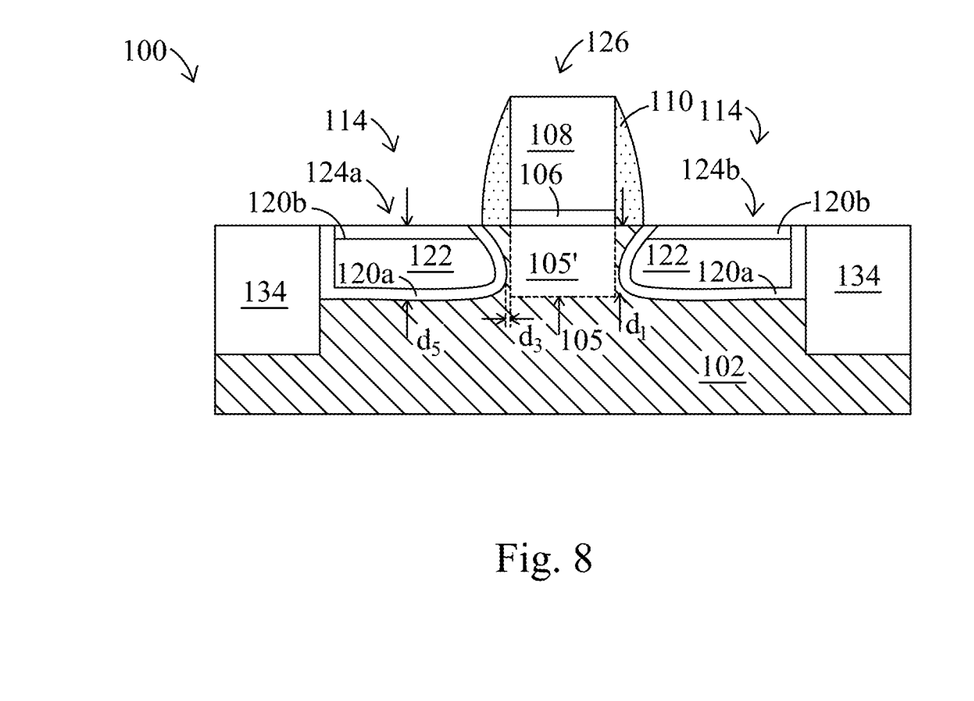
FIG. 8 shows an embodiment implemented in a planar transistor.

Embodiments of the present disclosure have been described herein with reference to FinFET devices. Alternatively, the embodiments described herein may be implemented in planar transistors, as shown in FIG. 8 in a cross-sectional view. To fabricate the semiconductor device 100, isolation regions 134 that may comprise STI regions or other insulating regions are formed in the workpiece 102. A gate dielectric 106 material and a gate 108 material are deposited over the workpiece 102 and patterned using lithography to form a gate dielectric 106 and a gate 108 of a transistor 126. The channel region 105' comprises a portion of the planar workpiece 102 beneath the gate dielectric 106, as shown. Sidewall spacers 110 are formed over the sides of the gate 108 and gate dielectric 106, and the recesses 114 are formed in the top surface of the workpiece 102 as described for the previous embodiments. The recesses 114 may comprise a depth having a dimension $d_5$ that is substantially the same as dimension $d_1$ of the channel region, or greater than dimension $d_1$, for example. The recesses 114 may comprise a rounded or oval shape in a cross-sectional view in some embodiments; however, the recesses 114 may alternatively comprise a trapezoidal shape. The recesses 114 may be filled with at least one contact resistance-lowering material layer 120, 120a, or 120b and a channel-stressing material layer 122 as described for the first, second, and third embodiments shown in FIGS. 2 through 6. An example of the first embodiment shown in FIGS. 2 through 4 is illustrated in FIG. 8, which includes two contact resistance-lowering material layers 120a and 120b.

Figure 9:
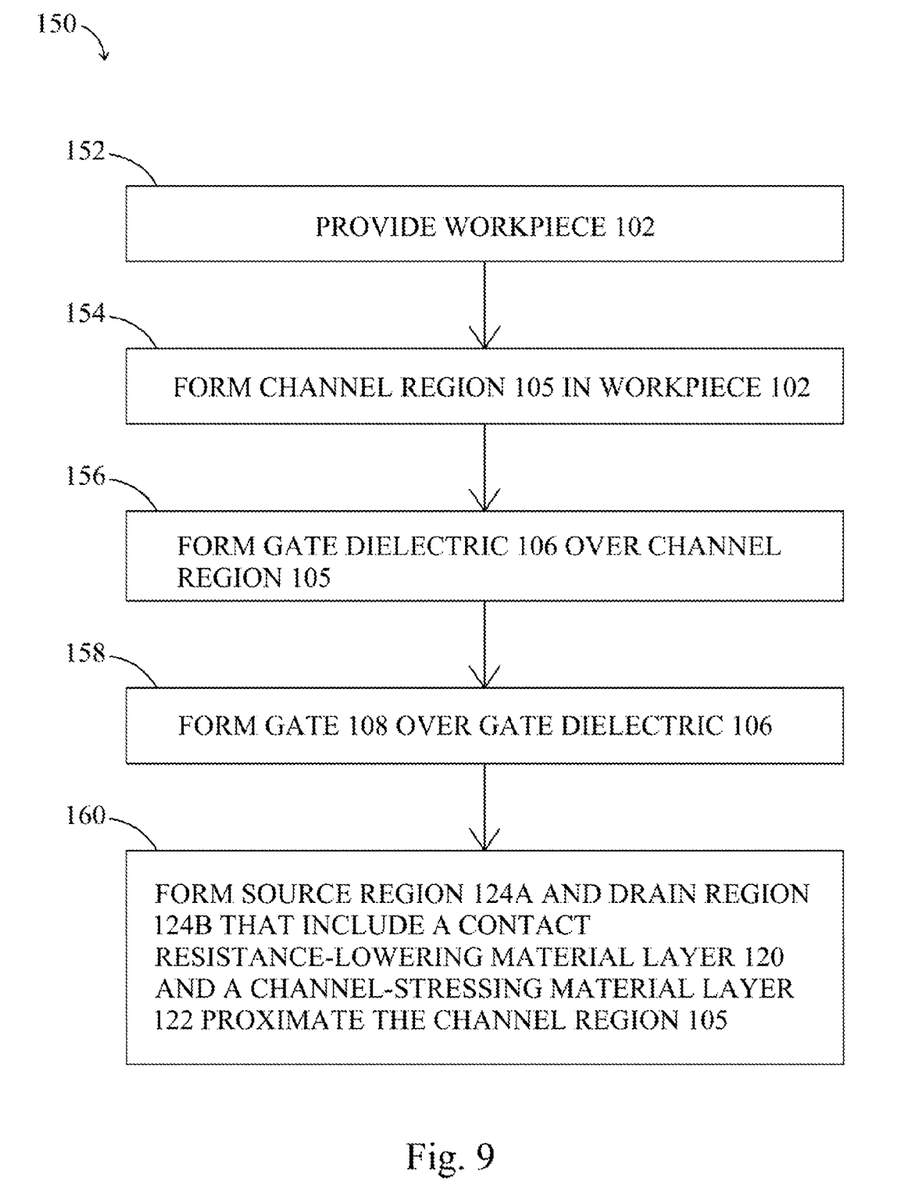
FIG. 9 is a flow chart of a method of manufacturing a semiconductor device in accordance with an embodiment.

FIG. 9 is a flow chart 150 of a method of manufacturing a semiconductor device 100 in accordance with an embodiment. The method includes providing the workpiece 102 (step 152) and forming a channel region 105 (e.g., comprising a fin 104) in the workpiece 102 (step 154). A gate dielectric 106 is formed over the channel region 105 (step 156), and a gate 108 is formed over the gate dielectric 108 (step 158). A source region 124a and a drain region 124b are formed proximate the channel region 105 (step 160), as described herein, wherein the source region 124a and the drain region 124b include a contact resistance-lowering material layer 120 (or layers 120a and 120b) and channel-stressing material layer 122 proximate the channel region 105.

Advantages of embodiments of the disclosure include providing novel methods of manufacturing and structures for multi-layer source and drain regions 124a and 124b of transistors 126. The multiple layers of the source and drain regions 124a and 124b may be formed in-situ sequentially by changing precursors, without removing the workpiece 102 from a manufacturing process chamber. The formation of the novel source and drain regions 124a and 124b does not require anneal processes or implantation processes, and the source and drain regions 124a and 124b may be formed using low temperatures. Forming the source and drain regions 124a and 124b may comprise using $AsH_3$ as a dopant gas rather than utilizing an implantation process to form the As in the source and drain regions 124a and 124b, for example. The novel manufacturing methods, structures, and designs described herein are easily implementable in manufacturing process flows.

The source regions 124a and drain regions 124b include multi-layer structures that comprise at least one contact resistance-lowering material layer 120, 120a, and 120b and a channel-stressing material layer 122. The contact resistance-lowering material layers 120a and 120b comprise SiP, SiAs, or a silicide, and the channel-stressing material layer 122 comprises SiCP or SiCAs. A contact resistance-lowering material layer 120b or 120 is disposed on a top surface of the source and drain regions 124a and 124b, lowering the contact resistance of the source and drain regions 124a and 124b. Furthermore, forming the recesses 114 in very close proximity to the channel regions 105 advantageously results in source and drain regions 124a and 124b residing a minimal distance away from the channel regions 105, which further reduces contact resistance.

The novel source and drain regions 124a and 124b of the transistors 126 formed comprise multi-layer structures that achieve improved functionality due to the lower contact resistance and increased stress on the channel regions 105 that comprise fins 104 in some embodiments and the channel regions 105' that comprise portions of a planar workpiece 102 in other embodiments. A material such as SiGe or a III-V compound semiconductor may be used for the channel regions 105 to achieve a high mobility in some embodiments. The low temperature growth processes used to form the material layers of the source and drain regions 124a and 124b advantageously prevents relaxation of the stress-inducing material of the channel-stressing material layers 122.

Embodiments of the present disclosure may be particularly beneficial in the formation of source and drain regions of n-channel metal oxide semiconductor (NMOS) transistors, for example, which often require n-type impurities such as P and As. Alternatively, the embodiments described herein are also useful when used in other types of transistors.

In accordance with one embodiment of the present disclosure, a method of manufacturing a semiconductor device includes forming a channel region in a workpiece, and forming a source or drain region proximate the channel region. The source or drain region includes a contact resistance-lowering material layer comprising SiP, SiAs, or a silicide. The source or drain region also includes a channel-stressing material layer comprising SiCP or SiCAs.

In accordance with another embodiment, a method of manufacturing a semiconductor device includes providing a workpiece, forming a channel region in the workpiece, and forming a gate dielectric over the channel region. The method includes forming a gate over the gate dielectric, and forming a source region and a drain region proximate the channel region. The source region and the drain region include a contact resistance-lowering material layer comprising SiP, SiAs, or a silicide. The source region and the drain region include a channel-stressing material layer comprising SiCP or SiCAs.

In accordance with yet another embodiment, a semiconductor device includes a transistor having a channel region disposed in a workpiece, a gate dielectric disposed over the channel region, a gate disposed over the gate dielectric, and a source region and a drain region proximate the channel region. The source region and the drain region include a contact resistance-lowering material layer comprising SiP, SiAs, or a silicide and a channel-stressing material layer comprising SiCP or SiCAs.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a channel region in a workpiece; and
    forming a source or drain region proximate the channel region comprising:
        recessing the workpiece proximate the channel region using an etch process;
        forming a first conformal liner having a first material composition on a bottom surface of the recess;
        forming a second conformal liner having a second material composition on sidewalls of the recess, the second material composition being different than the first material composition; and forming a contact resistance-lowering material layer and a channel-stressing material layer in the recess, wherein the contact resistance-lowering material layer comprises SiP, SiAs, or a silicide, and wherein the channel-stressing material layer comprises SiCP or SiCAs.

2. The method according to claim 1, wherein forming the source or drain region comprises forming the contact resistance-lowering material layer over the channel-stressing material layer.

3. The method according to claim 1, wherein forming the source or drain region comprises forming the channel-stressing material layer over the contact resistance-lowering material layer.

4. The method according to claim 3, wherein forming the contact resistance-lowering material layer comprises forming a first contact resistance-lowering material layer, further comprising forming a second contact resistance-lowering material layer over the channel-stressing material layer.

5. The method according to claim 1, wherein forming the channel region comprises forming SiGe or a III-V material.

6. The method according to claim 1, wherein forming the contact resistance-lowering material layer or the channel-stressing material layer does not include an implantation process or an anneal process.

7. The method according to claim 1, wherein the etch process comprises an anisotropic component.

8. The method according to claim 1, wherein forming the source or drain region comprises forming a source or drain region that is spaced apart from the channel region by about 20 nm or less at a widest point of the source or drain region.

9. A method of manufacturing a semiconductor device, the method comprising:
providing a workpiece;
forming a channel region in the workpiece;
forming a gate dielectric over the channel region;
forming a gate over the gate dielectric; and
forming a source region and a drain region proximate the channel region comprises:
epitaxially growing a contact resistance-lowering material layer comprising SiP or SiAs, the contact resistance-lowering material layer having a substantially uniform thickness; and
epitaxially growing a channel-stressing material layer comprising SiCP or SiCAs on the contact resistance-lowering material layer.

10. The method according to claim 9, wherein forming the semiconductor device comprises forming a fin field effect transistor (FinFET) or a planar transistor.

11. The method according to claim 9, wherein forming the source region and the drain region comprise forming recesses in the workpiece, further comprising:
forming a first liner on bottom surfaces of the recesses; and
forming a second liner on sidewalls of the recesses.

12. The method according to claim 11, wherein forming the first liner comprises forming SiP, and wherein forming the second liner comprises forming SiAs.

13. The method according to claim 9, wherein forming the source region and the drain region comprises using $AsH_3$ as a dopant gas.

14. A semiconductor device, comprising:
a transistor including:
a channel region disposed in a workpiece;
a gate dielectric disposed over the channel region;
a gate disposed over the gate dielectric; and
a source region and a drain region proximate the channel region, the source region and the drain region being disposed in recesses, the source region and the drain region including:
a first conformal liner having a first material composition on bottom surfaces of the recesses;
a second conformal liner having a second material composition on sidewalls of the recesses, the second material composition being different than the first material composition;
a contact resistance-lowering material layer comprising SiP, SiAs, or a silicide; and
a channel-stressing material layer comprising SiCP or SiCAs.

15. The semiconductor device according to claim 14, wherein the channel region comprises a fin of semiconductive material.

16. The semiconductor device according to claim 15, wherein the recesses in the workpiece are proximate the fin of semiconductive material.

17. The semiconductor device according to claim 16, wherein the fin comprises a height comprising a first dimension within the workpiece, wherein the recess comprises a depth comprising a second dimension, and wherein the second dimension comprises about twice the first dimension or greater.

18. The semiconductor device according to claim 17, wherein the contact resistance-lowering material layer is disposed over the channel-stressing material layer, and wherein the second dimension comprises about thrice the first dimension or greater.

19. The semiconductor device according to claim 18, wherein a boundary between the contact resistance-lowering material layer and the channel-stressing material layer is disposed proximate a bottom of the channel region.

20. The method of claim 1, wherein forming the first conformal liner comprises forming SiP, and wherein forming the second conformal liner comprises forming SiAs.

* * * * *